US008788982B2

(12) United States Patent
Lippincott et al.

(10) Patent No.: US 8,788,982 B2
(45) Date of Patent: *Jul. 22, 2014

(54) LAYOUT DESIGN DEFECT REPAIR USING INVERSE LITHOGRAPHY

(71) Applicant: Mentor Graphics Corporation, Wilsonville, OR (US)

(72) Inventors: George Lippincott, Lake Oswego, OR (US); Yuri Granik, Palo Alto, CA (US); Sergey Kobelkov, Moscow (RU)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,651

(22) Filed: Jan. 14, 2013

(65) Prior Publication Data

US 2013/0191795 A1   Jul. 25, 2013

Related U.S. Application Data

(63) Continuation-in-part of application No. 13/283,523, filed on Oct. 27, 2011, now Pat. No. 8,434,031, which is a continuation of application No. 12/710,352, filed on Feb. 22, 2010, now abandoned, which is a continuation-in-part of application No. 12/416,016, filed on Mar. 31, 2009, now abandoned, which is a continuation-in-part of application No. 12/359,174, filed on Jan. 23, 2009, now Pat. No. 7,987,434, which is a continuation-in-part of application No. 11/364,802, filed on Feb. 28, 2006, now Pat. No. 7,487,489.

(60) Provisional application No. 61/154,271, filed on Feb. 20, 2009, provisional application No. 61/041,197, filed on Mar. 31, 2008, provisional application No. 60/657,260, filed on Feb. 28, 2005, provisional application No. 60/658,278, filed on Mar. 2, 2005, provisional application No. 60/722,840, filed on Sep. 30, 2005, provisional application No. 60/792,476, filed on Apr. 14, 2006.

(51) Int. Cl.
  *G06F 17/50* (2006.01)
  *G03F 1/70* (2012.01)
  *G03F 1/36* (2012.01)
  *G03F 1/72* (2012.01)
  G03F 1/00 (2012.01)

(52) U.S. Cl.
  CPC .. *G03F 1/70* (2013.01); *G03F 1/36* (2013.01); *G03F 1/72* (2013.01); *G03F 1/144* (2013.01); *G03F 17/5081* (2013.01)
  USPC .............................................. 716/53; 716/132

(58) Field of Classification Search
  None
  See application file for complete search history.

(56) References Cited

U.S. PATENT DOCUMENTS 7,194,704 B2 *   3/2007   Kotani et al. .................... 716/52
7,617,475 B2 *   11/2009   Lin et al. ......................... 716/54

(Continued)

*Primary Examiner* — Leigh Garbowski

(57) ABSTRACT

Aspects of the invention relate to techniques for repairing layout design defects after layout data have been processed by resolution enhancement techniques. The repair process first determines a re-correction region that includes three portions: core, transition and visible portions. An inverse lithography process is then performed on the core and transition portions of the re-correction region while taking into account effects from the visible portion to generate a modified re-correction region. The transition portion is processed based on distance from boundary between the transition portion and the core portion such that layout features near the boundary between the transition portion and the core portion are adjusted more than layout features farther away from the boundary.

15 Claims, 8 Drawing Sheets

(56) References Cited

U.S. PATENT DOCUMENTS

| | | |
|---|---|---|
| 7,926,002 B2 | 4/2011 | Word |
| 8,082,525 B2 * | 12/2011 | Liu et al. .......... 716/52 |
| 8,370,773 B2 * | 2/2013 | Lucas et al. .......... 716/54 |
| 8,572,520 B2 * | 10/2013 | Chou et al. .......... 716/53 |
| 2008/0250383 A1 * | 10/2008 | Tanaka et al. .......... 716/21 |
| 2008/0301611 A1 * | 12/2008 | Word et al. .......... 716/9 |
| 2011/0191726 A1 | 8/2011 | Word |
| 2013/0191792 A1 * | 7/2013 | Word et al. .......... 716/52 |
| 2013/0198700 A1 * | 8/2013 | Sakajiri .......... 716/53 |

\* cited by examiner

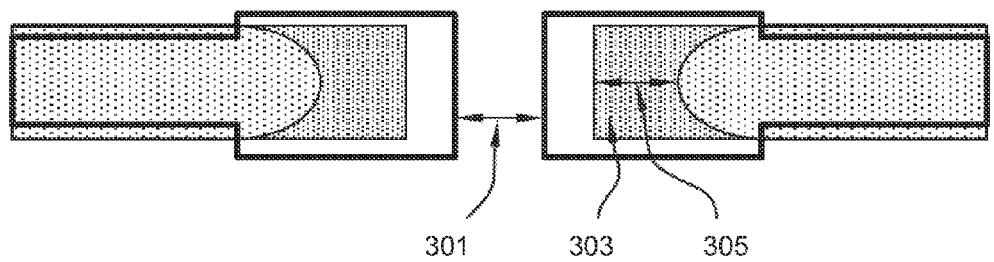
FIG. 3 —Prior Art—
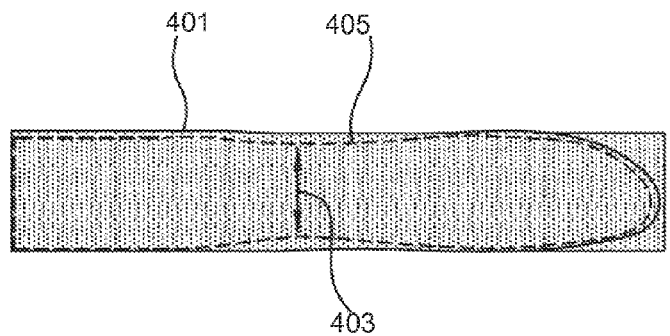
FIG. 4 —Prior Art—
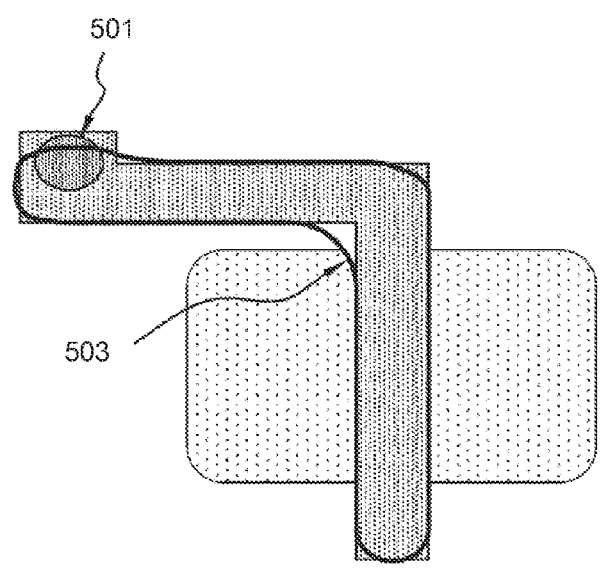
FIG. 5 —Prior Art—

FIG. 8 —Prior Art—

LAYOUT DESIGN DEFECT REPAIR USING INVERSE LITHOGRAPHY

RELATED APPLICATIONS

This application is a continuation-in-part of U.S. application Ser. No. 13/283,523, entitled "Inverse Mask Design and Correction for Electronic Design," filed on Oct. 27, 2011, which is a continuation of U.S. application Ser. No. 12/710,352, filed on Feb. 22, 2010, which in turn claims the benefit of U.S. Provisional Patent Application No. 61/154,271, entitled "Extreme Optical Process Correction," filed on Feb. 20, 2009.

The U.S. application Ser. No. 12/710,352 is also a continuation-in-part of U.S. application Ser. No. 12/416,016 entitled "Calculation System for Inverse Masks," filed Mar. 31, 2009, and naming Yuri Granik as inventor, which in turn claims the benefit of U.S. Provisional Patent Application No. 61/041,197, filed Mar. 31, 2008 and is itself a continuation-in-part of U.S. application Ser. No. 12/359,174, filed Jan. 23, 2009, now U.S. Pat. No. 7,987,434, which in turn claims the benefit of U.S. Provisional Patent Application No. 60/792,476 filed Apr. 14, 2006, and is a continuation in part of U.S. patent application Ser. No. 11/364,802 filed Feb. 28, 2006, now U.S. Pat. No. 7,487,489, which in turn claims the benefit of U.S. Provisional Patent Application No. 60/657,260 filed Feb. 28, 2005; U.S. Provisional Patent Application No. 60/658,278, filed Mar. 2, 2005; and U.S. Provisional Patent Application No. 60/722,840 filed Sep. 30, 2005.

All of the above previous-filed applications are incorporated entirely herein by reference.

FIELD OF THE INVENTION

The present invention relates to resolution enhancement technologies. Various implementations of the invention may be useful for selectively modifying layout design data used to create a mask.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design is again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components (e.g., contacts, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks. After the design is finalized, the design can be used by fabricated to manufacturer the device.

There are many different fabrication processes for manufacturing a circuit, but most processes include a series of steps which deposit layers of different materials on a substrate, expose specific portions of each layer to radiation, and etch the exposed (or non-exposed) portions of the layer away. For example, a simple semiconductor circuit could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, causing the exposed areas to be etched away, leaving behind exposed areas on the epitaxial layer, (i.e., areas no longer covered by the nitride layer). Specific shapes or patterns on these exposed areas then are subjected to a diffusion or ion implantation process. This causes dopants, (for example, phosphorus) to enter the exposed epitaxial layer and form negative wells. This process of depositing layers of material on the substrate or subsequent material layers, and then exposing specific patterns to radiation, dopants or other diffusion processes, is repeated a number of times. This series of steps allows the different physical layers of the circuit to be manufactured, forming gates, connecting layers, polysilicon layers, and eventually transistors on the substrate. The combination of these components make up what is often referred to as an integrated circuit device.

Each time that a layer is exposed to radiation or diffusion, a mask must be created to expose certain areas to the radiation or diffusion and protect the other areas from exposure. Each mask is created from circuit layout data. For each layer of material in the circuit that is masked and etched, corresponding layout design data must be used to create the mask. The geometric elements described in layout design data define the relative locations or areas of the circuit device that will be exposed to radiation or diffusion. A mask or reticle writing tool is used to create the mask or reticle based upon the layout design data, after which the mask can be used in a photolithographic process. This process of transferring the design from the mask to the substrate is often referred to as "printing" or "etching" the design.

As designers and manufacturers continue to increase the number of circuit components in a given area and/or shrink the size of circuit components, the shapes reproduced on the substrate (and thus the shapes in the mask) become smaller and closer together. This reduction in feature size increases the difficulty of faithfully reproducing the image intended by the layout design to the mask and onto the substrate. This difficulty often results in defects where the intended image is not accurately "printed" onto the substrate, creating flaws in the manufactured device. Accordingly, the terms "error" or "potential print error" are used herein to refer to a feature or group of features in layout design data that may not be accurately printed onto a substrate during a lithographic manufacturing process.

To address this problem, one or more resolution enhancement techniques are often employed. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, *Proceedings of SPIE Vol.* 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

As previously noted, a layout design is made up of a variety of geometric elements. In a conventional OPC process, the edges of the geometric elements (which are typically polygons) are fragmented, and the edge fragments are rearranged to reflect the desired modifications. For example, some OPC processes will reconfigure the edge fragments of a polygon to create serifs at one or more corners. The edge fragments are typically reconfigured according to one or more parameters, such as the size and spacing limitations on the edge fragments, or polygon placement. The values selected for these parameters have a significant impact on how and to what extent that the edge fragments within the layout data are modified during the OPC process. The set of parameter values used for an OPC process are often referred to as the "OPC recipe".

Once a layout design is finalized, it must be examined to ensure that the design does not have potential print errors (i.e., design features that may not be correctly printed during a lithograph process). If there are potential print errors, then these potential print errors must be corrected. For example, if the design includes only a few potential print errors, then a designer may either manually correct these errors. Alternately, a designer may employ an OPC process with a new recipe on the design to solve the problem. Again, the layout design must be examined to ensure that no potential print errors remain, and that the OPC process did not produce new potential print errors. If the design data does contain potential print errors, then the OPC process typically is repeated on the original layout design using a different set of process parameter values, in hopes that this different set of parameter values will correct the potential print errors.

While performing OPC on layout design data can improve the fidelity of the lithographic process, OPC can be expensive in terms of both computing resources and processing time. Layout designs can be very large, and even one layout data file for a single layer of a field programmable gate array may be approximately 58 gigabytes. Accordingly, performing even a single OPC process on a design is computationally intensive. Repeating an OPC process to correct remaining potential print errors then only adds to time required to finalize the layout design. On the other hand, manually correcting potential print errors is very time consuming as well.

BRIEF SUMMARY OF THE INVENTION

Aspects of the invention relate to techniques for repairing layout design defects after layout data have been processed by resolution enhancement techniques. In various embodiments of the invention, a layout design is first altered by a resolution enhancement process. The resolution enhancement process comprises an OPC process. The altered layout design is checked for errors. After one or more errors are detected, a repair process is initiated.

Around at least one of the one or more detected errors, a re-correction region is determined. The re-correction region, designating a sub-portion of the altered layout design, includes three portions: core, transition and visible portions. The core portion is enclosed by the transition portion and the transition portion is enclosed by the visible portion. The size for the visible portions may be determined based on optical diameter. In addition, resist effects may be taken into account.

An inverse lithography process is then performed on the core and transition portions of the re-correction region while taking into account effects from the visible portion of the re-correction region to generate a modified re-correction region. The transition portion is processed based on distance from boundary between the transition portion and the core portion such that layout features near the boundary between the transition portion and the core portion are adjusted more than layout features farther away from the boundary. Some embodiments of the invention employ a weighted combination of a first gradient and a second gradient. The first gradient is a normal gradient of an objective function used in a conventional inverse lithography process. The second gradient is a gradient of an objective function that is aimed at minimizing differences caused by the first gradient. The weighting for the second gradient may increase from zero at the boundary between the transition portion and the core portion to 100% at the boundary between the transition portion and the visible portion.

BRIEF DESCRIPTION OF THE DRAWINGS

FIG. 3 illustrates an example of an MRC limit causing a printing error.

FIG. 4 illustrates an example of a soft pinching failure at defocus.

FIG. 5 illustrates an example of two design intent failures.

DETAILED DESCRIPTION OF THE INVENTION

Figure 1:
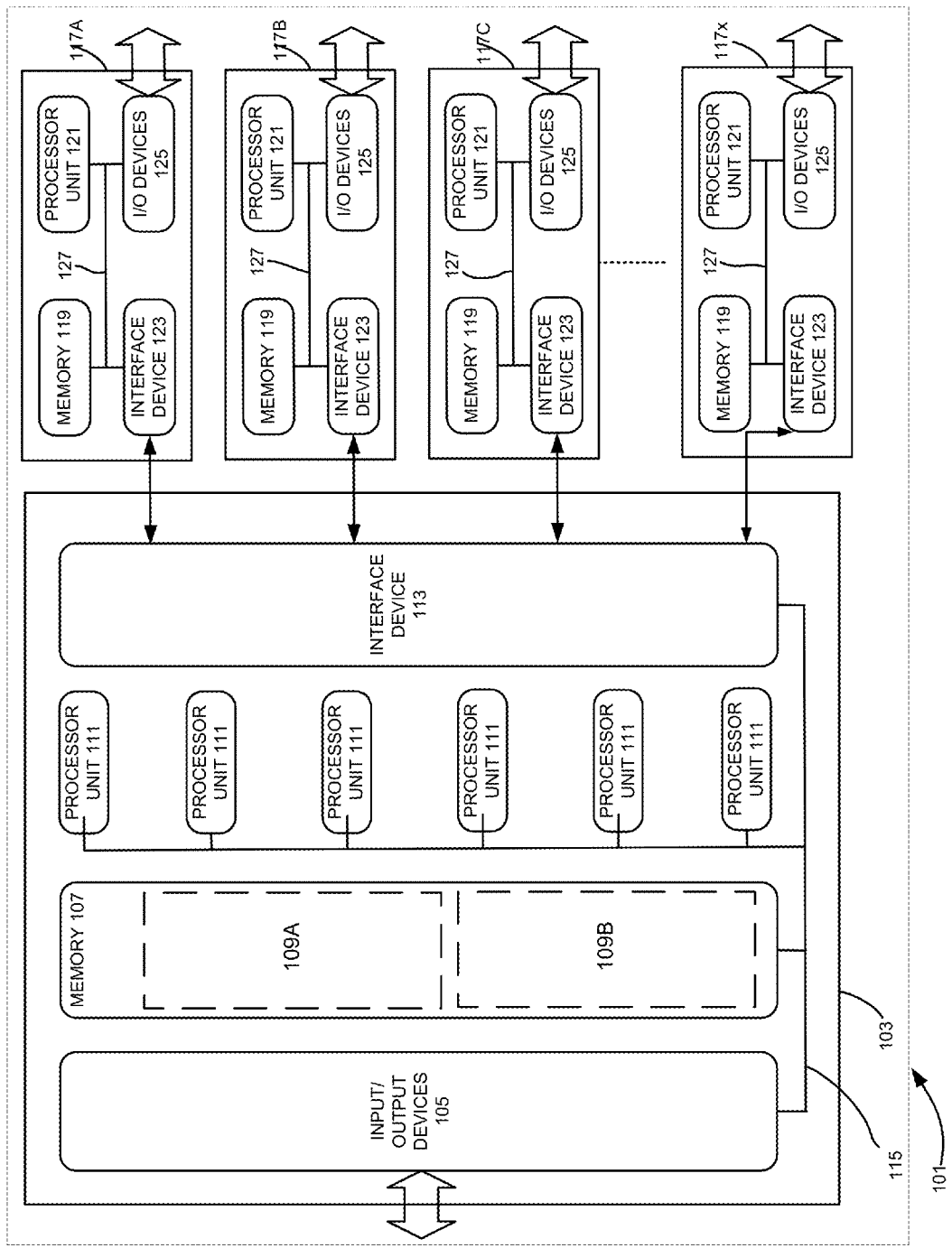
FIG. 1 illustrates an example of a computing system that may be used to implement various embodiments of the invention.

Various aspects of the present invention relate to layout design defect repair using inverse lithography. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "perform," "determine" and "check" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

In this disclosure, the terms "subcircuit" and "memory-circuit device groups" are used in a broad sense.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
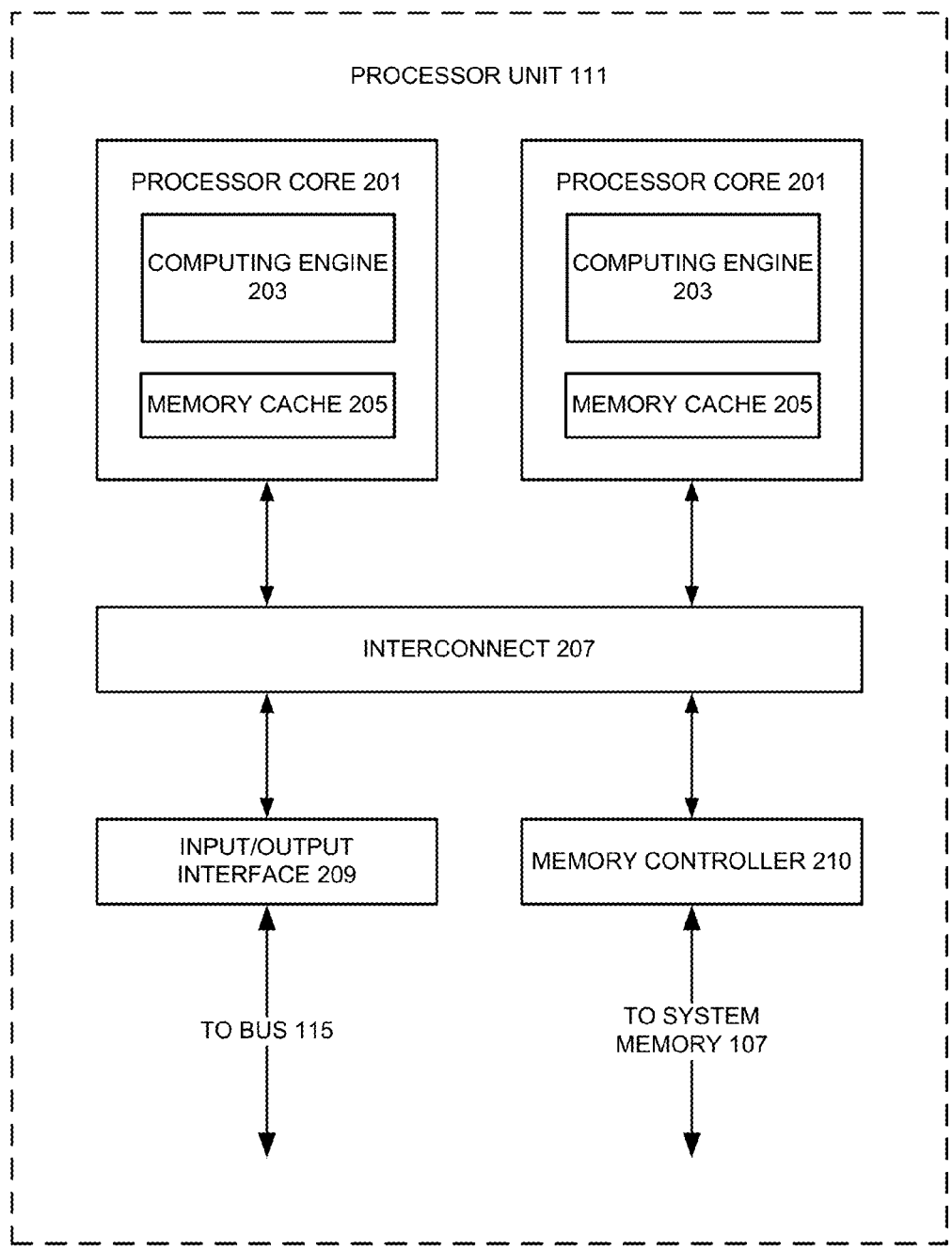
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Common Causes of Potential Print Errors

As discussed in detail above, OPC typically is performed on layout design data to improve the reproducibility of the design image during a lithographic manufacturing process. As also previously noted, even after an OPC process is performed, the layout design data may still include various potential print errors. One cause of such potential print errors is the non-convergence of edges during an OPC process. In this situation, one of the edges in a design has failed to completely realize the objective function of the OPC algorithm. Because OPC corrections typically are iterative (i.e., the lithographic process is simulated, an edge is moved, and the lithographic process is simulated again), insufficient iterations can result in non-converged edges. This is most commonly seen either in low-mask error enhancement factor (MEEF) areas, (i.e., areas where edge movements have limited impact on simulated edge placement), or in high-MEEF areas, (i.e., areas where oscillations can typically occur).

Another cause of potential print errors is mask rule constraint (MRC) limited edge movement. OPC recipes typically utilize user-defined controls to limit unmanageable reticle shapes. Such limitations (or other user supplied constraints) can prevent needed corrections from being made during an OPC process. FIG. 3 illustrates an example of an MRC limit inducing a printing problem. In FIG. 3, the minimum allowed mask space limit 301 prevents the OPC program from moving the line-end 303, and preventing the excessive pullback printing error 305.

Having edge fragments in a sub-optimal location can also cause a potential print error. As mentioned previously, design edges are subdivided into smaller edges known as fragments. These fragments are moved to achieve the desired OPC objective function. However, if the fragment locations are not ideal for realizing the objective, a failure can result. Yet another cause of potential print errors is process corner failure. If the final OPC layout data is verified at multiple focus and dose conditions, it is possible to have no defect locations at the nominal conditions, while failures exist at a process corner condition. This is shown graphically in FIG. 4. The nominal focus 401 shows no printing errors. However, a soft-pinching error 403 is manifest at defocus 405, after OPC is complete. Additionally, potential print errors can be caused by what is known as a design-intent failure. This is a condition where a simulated image may show no failure indicating printing errors, and yet the simulated result still fails to satisfy the intent of the designer. FIG. 5 shows two examples of design intent failures. In one case, the polysilicon coverage of the contact is insufficient 501. In the second case the gate length is too large, due to corner rounding 503.

Inverse Lithography

While traditional or conventional OPC can be employed to repair layout design defects that would cause print errors, as discussed in the U.S. Pat. No. 7,926,002, inverse lithography may lead to a better or simpler repair approach.

Figure 8:
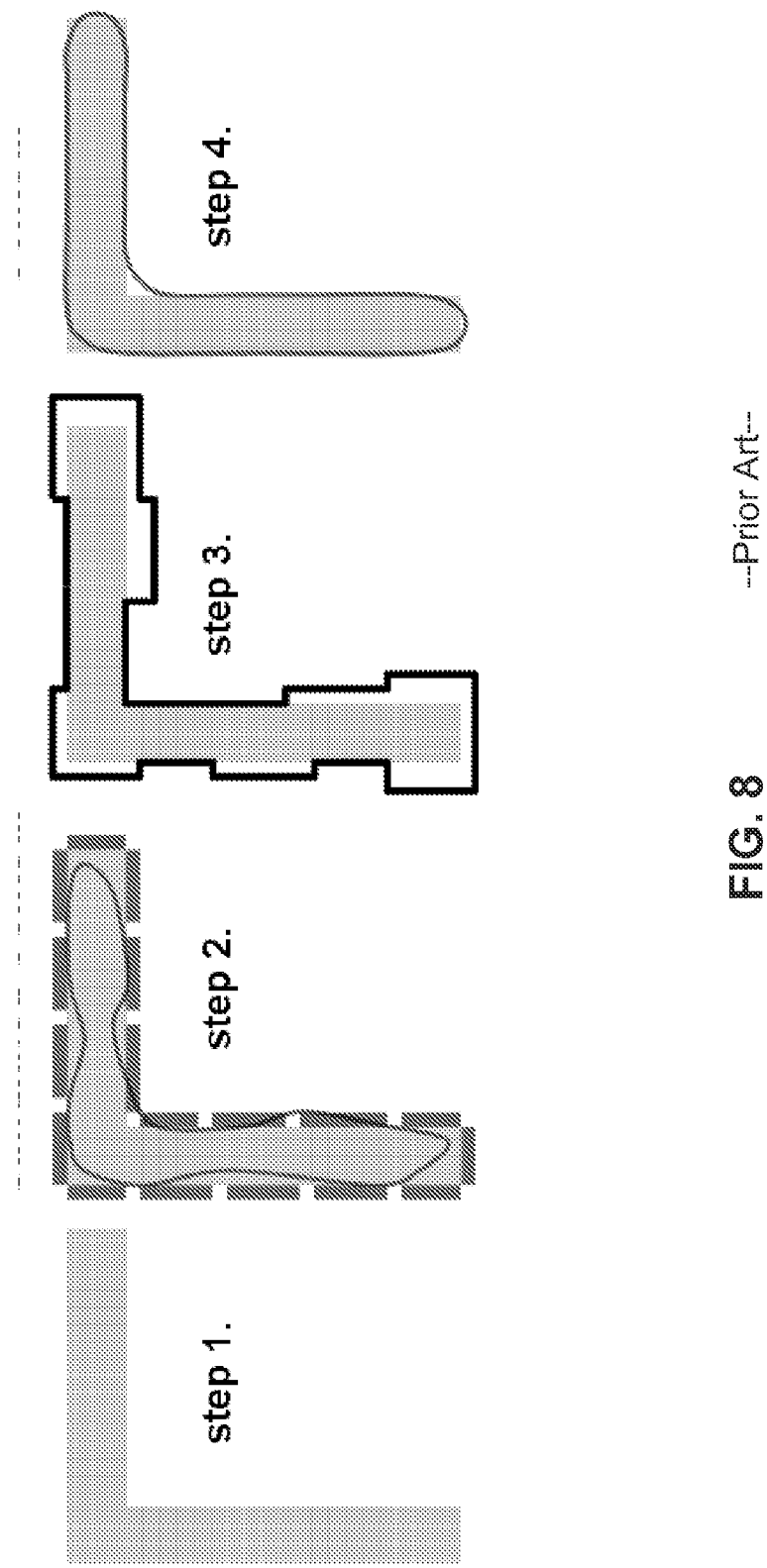
FIG. 8 illustrates an example of a correction flow traditionally used with model-based OPC.

Traditional OPC, while often referred to as "Model-based OPC" (MBOPC), usually comprises a mixture of rules and models. An example of a correction flow traditionally used with MBOPC is described in FIG. 8. The correction flow includes four basic steps: Step 1 shows an initial layout feature before correction, step 2 shows the layout feature after fragmentation and the initial optical/resist simulation, step 3 shows a typical mask result during correction and step 4 is the final simulated contour overlaid with the initial design layout.

After input of the designer's layout (step 1) the layout is fragmented (step 2). Fragmentation is the process by which the layout is divided into movable fragments, within which the edge-placement error (EPE) is computed. Fragmentation is needed to produce a manufacturable mask, and to simplify the OPC algorithm. In the next step (step 3) the mask is repeatedly simulated and the fragments displaced to gradually reduce the EPE to zero. The resulting output (step 4) should be a mask which enables faithful reproduction of the designer's intent on the wafer (limited by e.g., the diffractive nature of the imaging optics).

The above OPC flow can present several practical challenges to an OPC engineer. For example, fragments are most easily placed using a set of rules, which becomes increasingly more complex with each successive technology shrink. Image-based or adaptive fragmentation may alleviate some of these fragmentation challenges. Another challenge is related to MEEF. Each fragment is typically assigned a displacement to correct the EPE within the fragment in the above flow. However, in tightly-packed areas with high-MEEF, the movement of other fragments in the region can have a large impact on the EPE within the current fragment. The simplest solution to this problem is to apply a dampening (feedback) factor to the computed EPE, and repeatedly iteration to achieve a stable solution. Another proposed solution is the Matrix OPC concept where a MEEF Matrix is computed and inverted to more accurately determine the displacement for all fragments in a given region. Although solutions to the above problems (and others) exist, the solutions often involve an increased level of complexity in the OPC flow.

Inverse lithography, sometimes referred to as extreme OPC, inverse OPC, or pixOPC, treats the proximity correction problem as a constraint optimization problem over the domain of pixilated masks. Large pieces of the layout are usually broken down into rectangular frames. The sizes of frames may be dictated by the memory resources of the hardware, and ability to perform fast Fourier transformations. The frames are independently corrected for proximity effects, and then the frames are stitched together.

For each frame, the main objective G is a functional that expresses a deviation of the image I(x,y) from the threshold constant T along the target contours $C_i$ of the frame:

$$G = \sum_i \oint_{C_i} (I(\xi, \eta) - T)^2 dl \to \min. \quad (1)$$

Here $\zeta=\zeta(l)$ and $\eta=\eta(l)$ are Cartesian coordinates along the target contours; dl represents a contour integration element. The image I(x,y) is controlled by the mask, thus the main functional G depends on the mask transmission m=m(x,y), a complex-valued piece-wise constant function. Thus the constrained optimization problem may be stated as finding the mask m=m(x,y) that minimizes $$G[m] \to \min, \quad (2)$$

while constraining acceptable values of the mask transmission function to the constants $m_{min}$ and 1. For chrome masks $m_{min}$=0. For OMOG masks $m_{min}$ is a complex constant $m_{min} \approx$ (0.023, −0.022). The inverse lithography tries to find an analytical representation of the gradient of the objective, and then may use fast Fourier transformation to quickly calculate it.

The analytical expression for the gradient of the objective can be found by perturbing the mask m→m+δm and then finding the linear part of the perturbation of the objective δG. In the case of the objective (1), the following analytical expression for the gradient may be obtained:

$$g(x, y) = 4 \operatorname{Re} \sum_{k=1}^{N} \lambda_k \sum_i \int_{C_i} (I(\zeta, \eta) - T) A_k^*(\xi, \eta) K_k(\xi - x, \eta - y) dl \quad (3)$$

$$I(x, y) = \sum_{k=1}^{N} \lambda_k A_k^*(x, y) A_k(x, y)$$

$$A_k = K_k(x, y) \otimes m(x, y)$$

where N is the total number of optical kernels, $\lambda_n$ are weights of the optical kernels, $A_n$ is the electrical field from the n-th kernel $K_n$. The discretized version of (3) can be quickly calculated through fast Fourier transformations.

The gradient g(x,y) of the objective is used in the iterative procedure to move mask contours or to modify mask transmissions in a manner that reduced the value of the objective function G. Sub-resolution assist features (SRAFs) are automatically generated in an inverse lithography. Thus, the inverse lithography can also be used for SRAF repair.

OPC Repair Based on Inverse Lithography

Figure 6:
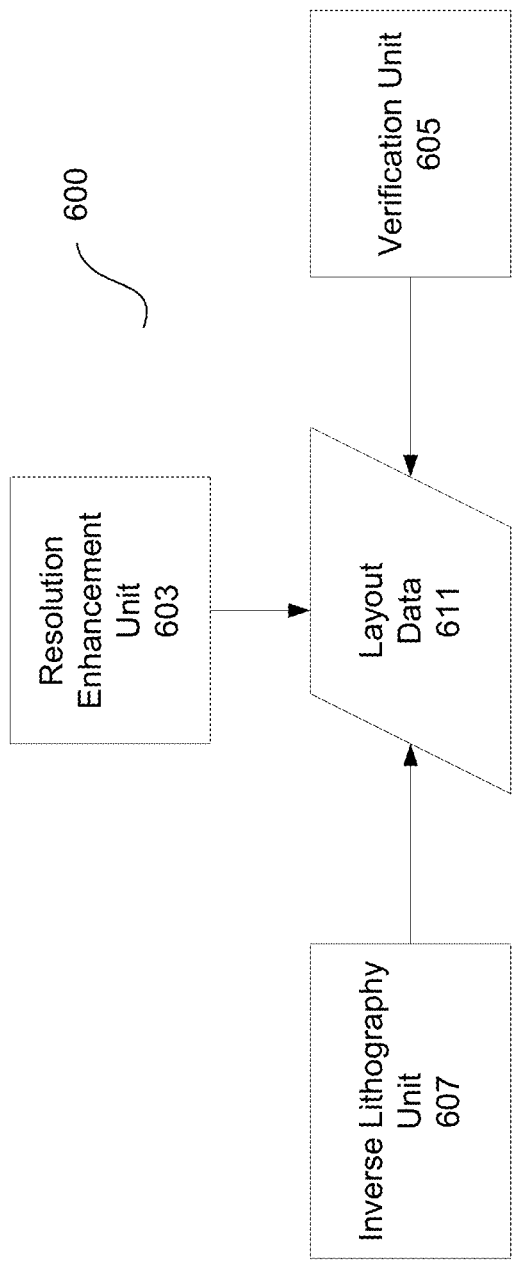
FIG. 6 illustrates a repair tool according to various implementations of the invention.

FIG. 6 illustrates an example of a repair tool 600 that may be implemented according to various embodiments of the invention. As seen in this figure, the repair tool 600 includes a resolution enhancement unit 603, a verification unit 605, and an inverse lithography unit 607. A resolution enhancement process including an OPC process is applied on layout design data 611 by the resolution enhancement unit 603. The altered layout design data is then checked for errors by the verification unit 605. Around a detected error, the inverse-lithography unit 607 designates a portion of the layout data as a re-correction region. The re-correction region includes three portions—core, transition and visible, wherein the core portion is enclosed by the context portion and the transition portion is enclosed by the visible portion. The inverse-lithography unit 607 then performs an inverse lithography process on the core and transition portions of the re-correction region while taking into account effects from the visible portion of the re-correction region to generate a modified re-correction region. The transition portion is processed based on distances of layout features from boundary between the transition portion and the core portion such that layout features near the boundary are adjusted more than layout features farther away from the boundary.

According to some embodiments of the invention, one or some of the resolution enhancement unit 603, the verification unit 605, and the inverse lithography unit 607 may be implemented by one or more computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or some of the resolution enhancement unit 603, the verification unit 605, and the inverse lithography unit 607. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 7:
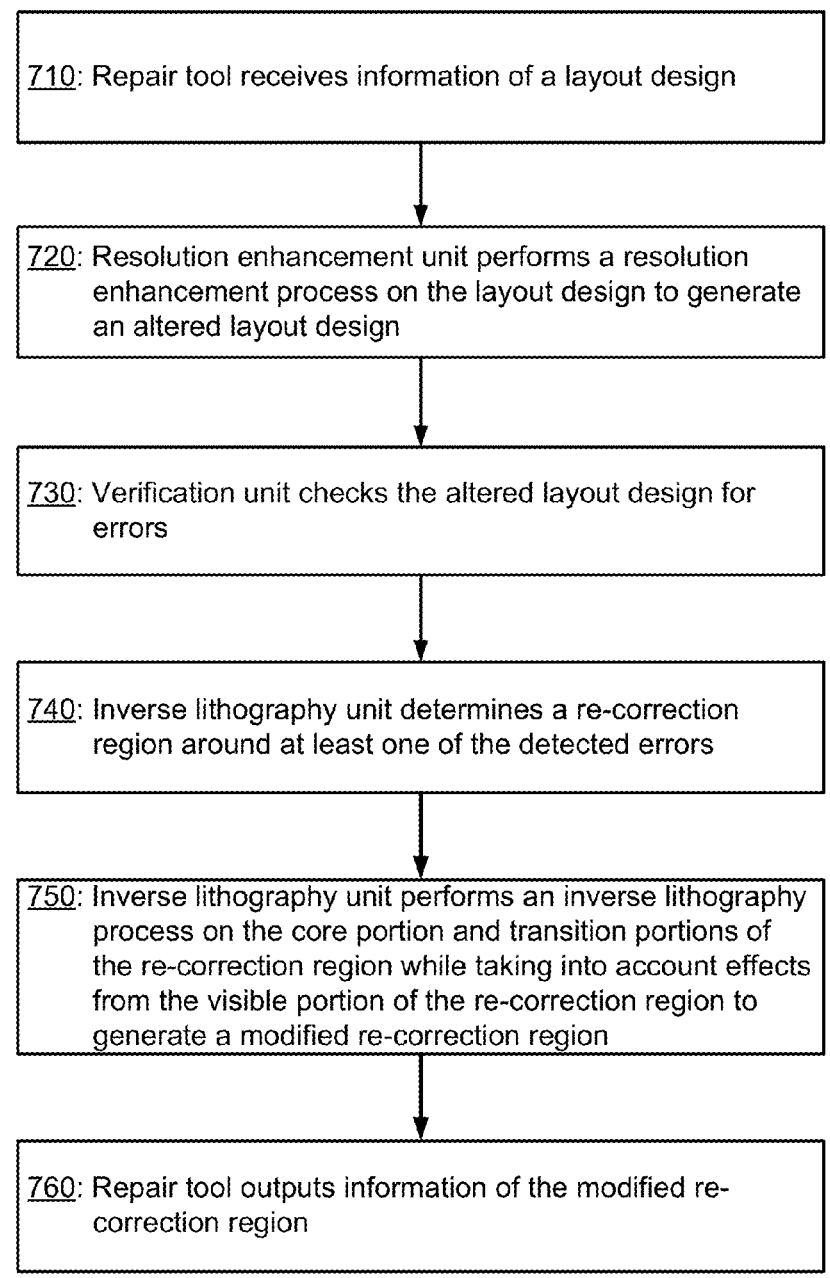
FIG. 7 illustrates a flow chart describing an OPC repair method according to various implementation of the invention.

For ease of understanding, OPC repair methods that may be employed according to various embodiments of the invention will be described with reference to the repair tool 600 in FIG. 6 and the flow chart 700 illustrated in FIG. 7. It should be appreciated, however, that alternate implementations of a repair tool may be used to perform the OPC repair methods illustrated by the flow chart 700 according to various embodiments of the invention. Likewise, the repair tool 700 may be employed to perform other OPC repair methods according to various embodiments of the invention.

Initially, in operation 710 of the flowchart 700, the repair tool 600 receives information of a layout design. The layout design represents at least a portion of an integrated circuit design.

In operation 720, the resolution enhancement unit 603 performs a resolution enhancement process on the layout design to generate an altered layout design. The resolution enhancement process usually includes an OPC process.

Figure 9:
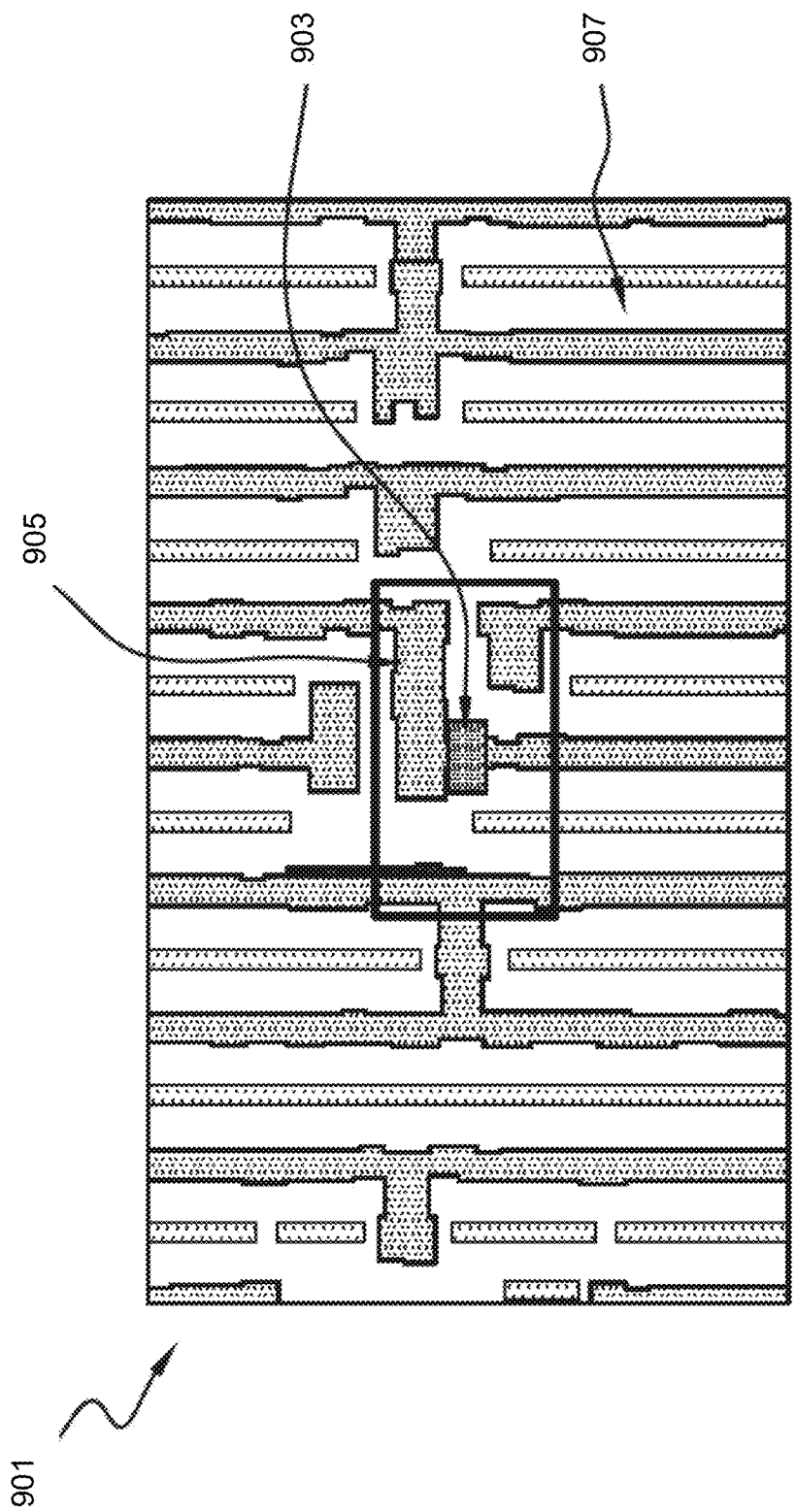
FIG. 9 illustrates an example of a layout design region that includes an error marker, and core and context portions of a re-correction region.

As discussed previously, the initial OPC process is often not able to generate a perfect layout design due to various causes. Thus, in operation 730, the verification unit 605 checked the altered layout design for errors. With some implementations of the invention, an error marker is generated for each of the detected errors. Each error marker indicates a layout region where a corresponding detected error resides and thus where OPC repair may be needed. A simple geometric shape such as a rectangular may be used as an error marker. FIG. 9 illustrates an example of a layout design region that includes an error marker. The error marker 903, generated by the verification unit 605, is a rectangular feature.

It should also be appreciated that the repair tool 600 may not comprise either the resolution enhancement unit 603 or both the resolution enhancement unit 603 and the verification unit 605. In the latter case, the operations 710-730 becomes a single operation: the repair tool 600 receives information of an altered layout design and one or more errors detected in the altered layout design, wherein the altered layout design is generated by performing a resolution enhancement process on a layout design, and the layout design represents at least a portion of an integrated circuit design.

Next, in operation 740, the inverse lithography unit 607 determines a re-correction region around a detected error. The re-correction region, designating a sub-portion of the altered layout design, includes three portions—core, transition and visible. The core portion is enclosed by the transition portion and the transition portion is enclosed by the visible portion. FIG. 9 illustrates an example of the core (905) and transition (907) portions of a re-correction region (901). The visible portion is not shown. The size (width) of the visible portion may be determined based at least in part on optical diameter. Resist effects may also be taken into account. Some embodiments of the invention set these distances at 1-2 μm.

Figure 10:
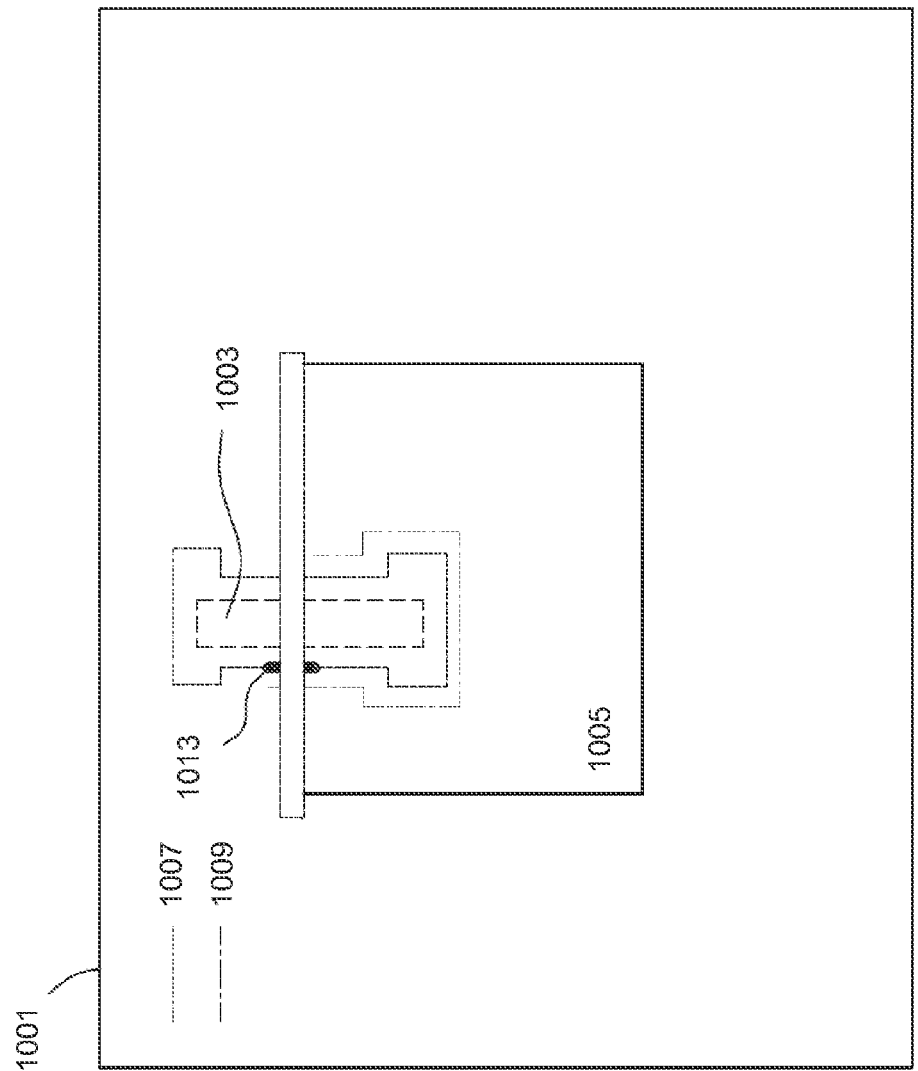
FIG. 10 illustrates an example of a layout feature of which two parts need to be stitched together.

The transition portion is used to help with border handling. Layout features in the core portion are to be processed by the inverse lithography unit 607 in the next operation while layout features in the visible region are kept the same. Without the transition portion, some layout features that extend over both the core and visible portions may have a "jog" problem at the boundary of the core and visible portions. The jog problem could cause an additional print error or a mask rule check (MRC) violation. FIG. 10 illustrates such an example. As seen in this figure, the layout data 1001 includes polygon edges 1007 and polygon edges 1009 that were created by the inverse lithography from an initial polygon shape 1003. The polygon edges 1007 are not aligned with the polygon edges 1009 at the boundary 1005 between the core and visible portions. While stitching and/or smart cut techniques can solve the problem, these additional actions may be avoided if the transition portion is used. The details will be discussed below.

The determination of the three portions of the re-correction region may be performed at the same time or different times. Different names may be used for these portions.

Next, in operation 750, the inverse lithography unit 607 performs an inverse lithography process on the core portion of and the transition portion of the re-correction region while taking into account effects from the visible portion of the re-correction region to generate a modified re-correction region. The core portion is processed mainly to correct the defect(s) or error(s) in the core portion while the transition portion is processed mainly to make a smooth transition from the modified core portion to the unmodified visible portion. Accordingly, the core portion and the transition portions are processed differently.

In the transition portion, the inverse lithography unit 607 treats layout features in the transition portion based on their distances from boundary between the transition portion and the core portion such that layout features near the boundary between the transition portion and the core portion are adjusted by inverse lithography more than layout features farther away from the boundary. With some implementations of the invention, a weighted combination of a first gradient and a second gradient may be used. The first gradient is a normal gradient used in a conventional inverse lithography process such as g(x,y) discussed previously. The second gradient is a gradient of an objective function that is aimed at minimizing differences between the original mask and the current mask or caused by the normal gradient. The weighting for the second gradient increases from zero at the boundary between the transition portion and the core portion to 100% at the boundary between the transition portion and the visible portion.

The core portion may be considered as a region where the inverse lithography process is performed with a zero weighting for the second gradient. Similarly, the visible portion may be considered as a portion where the inverse lithography process is performed with a 100% weighting for the second gradient. In the latter case, an addition portion outside of the visible portion may need to be considered.

As will be appreciated by those of ordinary skill in the art, various other techniques may be adopted to allow layout features closer to the boundary between the transition portion and the core portion to be adjusted more than those farther away from the boundary.

Lastly, in operation 760, the repair tool 600 outputs repair results. For example, the modified re-correction region may be saved to a memory storage location. The repair tool 600 may further replace the re-correction region in the altered layout design with the modified re-correction region As will be appreciated by those of ordinary skill in the art, the disclosed technology can be applied to multiple errors concurrently.

As also will be appreciated by those of ordinary skill in the art, the disclosed technology of using a transition portion can be applied to layout design defect repair using OPC techniques other than the inverse lithography.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more non-transitory computer-readable media storing computer-executable instructions for causing one or more processors to perform a method, the method comprising:

receiving information of an altered layout design and one or more errors detected in the altered layout design, the altered layout design generated by performing a resolution enhancement process on a layout design, the layout design representing at least a portion of an integrated circuit design;

determining a re-correction region around at least one of the one or more detected errors, wherein the re-correction region designates a sub-portion of the altered layout design and includes three portions—core, transition and visible, wherein the core portion is enclosed by the transition portion and the transition portion is enclosed by the visible portion;

performing an optical proximity correction process on the core portion of and the transition portion of the re-correction region while taking into account effects from the visible portion of the re-correction region to generate a modified re-correction region, wherein the transition portion is processed based on distance from boundary between the transition portion and the core portion such that layout features near the boundary between the transition portion and the core portion are adjusted more than layout features farther away from the boundary;

saving information of the modified re-correction region to a memory storage location.

2. The one or more non-transitory computer-readable media recited in claim 1, wherein the optical proximity correction process is an inverse lithography process.

3. The one or more non-transitory computer-readable media recited in claim 2, wherein the inverse lithography process uses a weighted combination of a first gradient and a second gradient for the transition portion, wherein the weighting for the second gradient increases from zero at the boundary between the transition portion and the core portion to 100% at the boundary between the transition portion and the visible portion.

4. The one or more non-transitory computer-readable media recited in claim 1, wherein width of the visible region is based at least in part on optical diameter.

5. The one or more non-transitory computer-readable media recited in claim 1, wherein the method further comprises replacing the re-correction region in the altered layout design with the modified re-correction region.

6. A method, comprising:
with a computer,
receiving information of an altered layout design and one or more errors detected in the altered layout design, the altered layout design generated by performing a resolution enhancement process on a layout design, the layout design representing at least a portion of an integrated circuit design;

determining a re-correction region around at least one of the one or more detected errors, wherein the re-correction region designates a sub-portion of the altered layout design and includes three portions—core, transition and visible, wherein the core portion is enclosed by the transition portion and the transition portion is enclosed by the visible portion;

performing an optical proximity correction process on the core portion of and the transition portion of the re-correction region while taking into account effects from the visible portion of the re-correction region to generate a modified re-correction region, wherein the transition portion is processed based on distance from boundary between the transition portion and the core portion such that layout features near the boundary between the transition portion and the core portion are adjusted more than layout features farther away from the boundary;

saving information of the modified re-correction region to a memory storage location.

7. The method recited in claim 6, wherein the optical proximity correction process is an inverse lithography process.

8. The method recited in claim 7, wherein the inverse lithography process uses a weighted combination of a first gradient and a second gradient for the transition portion, wherein the weighting for the second gradient increases from zero at the boundary between the transition portion and the core portion to 100% at the boundary between the transition portion and the visible portion.

9. The method recited in claim 6, wherein width of the visible region is based at least in part on optical diameter.

10. The method recited in claim 6, further comprising:
replacing the re-correction region in the altered layout design with the modified re-correction region.

11. A system comprising:
receiving information of an altered layout design and one or more errors detected in the altered layout design, the altered layout design generated by performing a resolution enhancement process on a layout design, the layout design representing at least a portion of an integrated circuit design;

determining a re-correction region around at least one of the one or more detected errors, wherein the re-correction region designates a sub-portion of the altered layout design and includes three portions—core, transition and visible, wherein the core portion is enclosed by the transition portion and the transition portion is enclosed by the visible portion;

performing an optical proximity correction process on the core portion of and the transition portion of the re-correction region while taking into account effects from the visible portion of the re-correction region to generate a modified re-correction region, wherein the transition portion is processed based on distance from boundary between the transition portion and the core portion such that layout features near the boundary between the transition portion and the core portion are adjusted more than layout features farther away from the boundary;

saving information of the modified re-correction region to a memory storage location.

12. The system recited in claim 11, wherein the optical proximity correction process is an inverse lithography process.

13. The system recited in claim 12, wherein the inverse lithography process uses a weighted combination of a first gradient and a second gradient for the transition portion, wherein the weighting for the second gradient increases from zero at the boundary between the transition portion and the core portion to 100% at the boundary between the transition portion and the visible portion.

14. The system recited in claim 11, wherein width of the visible region is based at least in part on optical diameter.

15. The system recited in claim 11, wherein the method further comprises replacing the re-correction region in the altered layout design with the modified re-correction region.

* * * * *